United States Patent
Lamy et al.

(10) Patent No.: US 12,042,890 B2
(45) Date of Patent: Jul. 23, 2024

(54) METHOD FOR MANUFACTURING A HEAT SINK

(71) Applicants: BULL SAS, Les Clayes-sous-bois (FR); Le Commissariat à l'énergie atomique et aux énergies alternatives (CEA), Paris (FR)

(72) Inventors: Pierre Lamy, Paris (FR); Fabien Demange, Achères (FR)

(73) Assignees: BULL SAS, Les Clayes-sous-bois (FR); Le Commissariat à l'énergie atomique et aux énergies alternatives (CEA), Paris (FR)

( * ) Notice: Subject to any disclaimer, the term of this patent is extended or adjusted under 35 U.S.C. 154(b) by 0 days.

(21) Appl. No.: 18/469,545

(22) Filed: Sep. 18, 2023

(65) Prior Publication Data
US 2024/0100636 A1  Mar. 28, 2024

(51) Int. Cl.
  *B23P 15/26* (2006.01)
(52) U.S. Cl.
  CPC .................................. *B23P 15/26* (2013.01)
(58) Field of Classification Search
  CPC ............ F28D 2021/0028; B23P 15/26; Y10T 29/49366; Y10T 29/4939; Y10T 29/4935; B23K 20/127; B23K 2101/14
  See application file for complete search history.

(56) References Cited

U.S. PATENT DOCUMENTS

| | | | | |
|---|---|---|---|---|
| 8,627,567 B2 * | 1/2014 | Seo | ..................... | B23K 20/1265 29/890.03 |
| 8,966,759 B1 * | 3/2015 | Romero | ................ | H01L 23/473 29/890.032 |
| 9,003,649 B1 * | 4/2015 | Romero | ............... | B23K 20/127 29/830 |
| 9,423,192 B2 * | 8/2016 | Tsoi | .................... | F28D 15/0233 |
| 9,795,057 B2 * | 10/2017 | Reeves | .............. | H05K 7/20927 |
| 9,999,941 B2 * | 6/2018 | Hori | ..................... | B23K 20/126 |
| 10,471,557 B2 * | 11/2019 | Hori | ........................ | B23P 15/26 |
| 11,723,174 B2 * | 8/2023 | Chen | ........................ | F28F 9/18 29/890.03 |
| 2018/0320993 A1 | 11/2018 | Parag et al. | | |
| 2021/0176896 A1 | 6/2021 | Yang et al. | | |
| 2022/0065561 A1 * | 3/2022 | Chen | ..................... | F28F 21/089 |

FOREIGN PATENT DOCUMENTS

| | | |
|---|---|---|
| EP | 2770809 B1 | 2/2014 |
| EP | 2770810 B1 | 2/2014 |
| WO | 2019/115963 A1 | 6/2019 |

OTHER PUBLICATIONS

Search Report issued in EP22306437.9 on Mar. 17, 2023.

* cited by examiner

*Primary Examiner* — Jason L Vaughan
(74) *Attorney, Agent, or Firm* — ARC IP Law, PC; Joseph J. Mayo

(57) ABSTRACT

Method for manufacturing a heat sink for liquid cooling system of a compute blade of a supercomputer, comprising in particular a friction-stir welding step of a base plate at a machined central rib and at a machined rim.

10 Claims, 5 Drawing Sheets

METHOD FOR MANUFACTURING A HEAT SINK

This application claims priority to European Patent Application Number 22306437.9, filed 28 Sep. 2022, the specification of which is hereby incorporated herein by reference.

BACKGROUND OF THE INVENTION

Technical Field of the Invention

At least one embodiment of the invention relates to the field of computer processor cooling and relates more particularly to a heat sink for a supercomputer electronic board.

Description of the Related Art

Server compute blades, in particular for supercomputers, generally comprise electronic boards, in particular processors, which emit heat and must therefore be cooled. Initially, these electronic boards were cooled by air. However, in the case of rack-mountable servers, the air circulation is not sufficient to cool the electronic boards. To solve this problem, fluidic cooling systems have been developed.

Among the known electronic board cooling solutions, IBM® has developed a dual processor electronic board mixed cooling system for supercomputers. Such a system comprises copper pipes containing a heat transfer fluid forming a liquid loop. However, the rigidity of copper pipes does not allow quick disassembly from a single processor. In addition, the liquid loop ensures cooling of the processors only. The rest of the dissipated power is cooled by convection in the air, which is not optimal for the power usage effectiveness (PUE) of the supercomputer.

Other electronic board manufacturers offer liquid cooling systems dedicated solely to processors. The latter incorporate a heat sink, built-in pump and exchanger to extract the calories. Of course, such devices are not compatible with larger systems such as supercomputers due to space constraints.

The applicant has further developed a mixed cooling system wherein the electronic boards are cooled by means of a cold aluminum plate wherein a heat transfer fluid circulates, the cold plate being interfaced with all the low and middle electronic components to be cooled, i.e. all the components of an electronic board excluding the high electronic components (typically the processors and memory modules). Processors are the most constraining components to cool (because they must remain accessible) and also the most dissipative. They cannot be interfaced with the cold plate directly. To ensure thermal contact with the processors, each of them is interfaced with an intermediate heat sink with heat pipes. It is a phase-changed two-phase heat sink (usually referred to as "Heat Spreader CPU"), which conducts heat from the processors to the cold plate. The part of the heat pipes in contact with the copper slab that interfaces the processor constitutes the evaporator, while the part in contact with the cold plate constitutes the condenser. This solution is described in more detail in European patent applications EP 2770809 and EP 2770810 belonging to the applicant.

This processor cooling solution using heat pipes also has disadvantages, and in particular:

thermal limits specific to heat pipes: the flow inside a heat pipe is two-phase and is governed by five limits in terms of flow, viscosity, boiling, driving, capillarity, which depend on the dimensions of the heat pipes and the power to evacuate.

mechanical limits: the increase in the number of heat pipes results in an increase in the rigidity of the assembly. However, in order to compensate for tolerances, it is essential that the heat sink deforms sufficiently.

a high number of removable thermal interfaces: thermal contacts must be ensured between the cold plate and the heat sink on the one hand, and between the heat sink and the processor on the other. In the current solution implemented by the applicant, these thermal contacts are guaranteed by the use of conductive grease, which has the disadvantage of generating a high temperature gradient.

the complexity and cost of the overall solution: the solid/fluid exchange surfaces are currently at the cold plate. The complexity of the latter in terms of heat sinks considerably increases machining in the cold plate and hence the manufacturing cost.

To solve the aforementioned defects and disadvantages, the applicant has developed a cooling system for an electronic board that is fully liquid, comprising a cold plate supplied with heat transfer fluid via a water path internal to the cold plate, and a plurality of heat sinks connected in flexible connections with the water path internal to the cold plate. These flexible connections form a flexible network coupled to the network of rigid channels of the cold plate supplied with heat transfer fluid (typically glycol water), thus allowing the supply of heat transfer fluid to the heat sinks. This network is coupled with the cold plate system allowing cooling of the rest of the electronic board. In order to optimize the cooling of the processor as much as possible, the heat transfer fluid must be brought as close as possible to the heat source. To this end, the applicant has specifically developed a single-phase heat sink comprising a cooling block of heat-conducting material that may be supplied with heat transfer fluid. The heat source constituted by the processor will therefore be directly interfaced with this cooling block (also referred to in the examples by the term "waterblock") supplied with heat transfer fluid taken from the cold plate. Such an integrated cooling system meets the constraints of thermal efficiency, mechanical compactness and maintainability necessary for this type of high-performance computing equipment. This solution is described in detail in WO2019115963.

Conventionally, small-sized liquid cooling elements (waterblock) are produced using a continuous or vacuum brazing process. This technology allows the various parts of the cooling solution to be permanently attached and provides a seal between the internal hydraulic cavity and the exterior. One of the advantages of this solution is the ability to solidify parts with complex geometry and a small size. To solidify the parts, brazing requires applying to the parts beforehand a brazing flux, which is a chemical composition making up a fastening primer, in order to clean and prepare the contact surfaces. A brazing paste is then applied as a joining element between the parts, this paste being composed of metal with a low melting point operating as a glue.

However, this solution has several disadvantages. Firstly, the use of brazing flux is a factor in the degradation of the anti-corrosion properties of coolants in cooling systems, generating pollution that blocks heat exchange zones and degrades the performance of the cooling system. In addition, the brazing paste may migrate into the cooling system cavity, and in particular block the fins in the heat exchange zone, also impacting the thermal performance of the system. In addition, continuous brazing may involve aluminum parts in a less thermally efficient alloy, i.e. with lower conductivity and less resistance over time, especially in the 3003 series of aluminum. Prior solutions are not optimized for a supercomputer hydraulic network for aluminum brazing and do not meet the required service life, material homogeneity and thermal performance criteria.

There is therefore a need for a simple and effective solution that makes it possible to overcome at least some of these disadvantages.

BRIEF SUMMARY OF THE INVENTION

To this end, at least one embodiment of the invention relates to a method for manufacturing a heat sink for a liquid cooling system, in particular a supercomputer compute blade, the heat sink including a body, a fluidic connection member and a heat dissipation fin module, the body including a heat collection face, intended to be positioned beside an electronic component generating heat, a fluidic connection face, opposite the heat collection face, the body delimiting a central through-opening connecting the heat collection face and the fluidic connection face, the fluidic connection member including a central part of parallelepiped shape from which extends, from a first face, a fastening element and, from a second face, two circulation conduits of a cooling liquid, the heat dissipation fins module including a base plate and at least two assemblies of fins extending from a face of the base plate, of the method including:
- positioning the fastening element of the fluidic connection member in the through-opening of the body so as to be flush with the heat collection face of the body,
- machining the heat collection face so as to form two receiving cavities for the fin assemblies of the fin module, a central rib, made of both material of the fastening element of the fluidic connection member and material of the heat collection face of the body, and a support rim of the base plate of the fin module,
- placing the fin module on the body bearing on the rim so that each assembly of fins is arranged (i.e. placed) in one of the cavities,
- friction-stir welding of the base plate at the machined central rib and at the machined rim.

Creating a central rib and a rim allows passage of the head of the friction-stir welding tool. In particular, by way of one or more embodiments, joining parts by friction-stir welding makes it possible to manufacture a heat sink resistant to the pressure of the hydraulic coolant network. The central rib is a stiffener making it possible to fasten all the parts together, particularly at the stiffener, to guarantee resistance under pressure while making the heat sink solid. The method according to at least one embodiment of the invention notably makes it possible to obtain a heat sink presenting repeatable mechanical, hydraulic and thermal performance at low cost. Friction-stir welding enables the use of particularly heat-conductive materials. The method according to one or more embodiments of the invention avoids the use of filler material (flux, brazing paste), making it possible to limit degradations of the properties of the fluid used. The heat sink obtained with the method according to at least one embodiment of the invention further makes it possible to respect the space allocated in the mechanical environment of the compute blades. In particular, the method according to one or more embodiments of the invention makes it possible to permanently assemble a liquid-cooled heat sink, of small size and complex geometry, without any difference in cost compared to prior solutions.

According to at least one embodiment of the invention, the base plate is welded over more than half the length of the central rib in order to improve the strength of the connection between the central rib and the base plate of the fin module.

Preferably, by way of one or more embodiments, the base plate is welded over more than three-quarters of the length of the central rib, for example over the entire length of the central rib, in order to further improve the strength of the connection between the central rib and the base plate of the fin module.

More preferably, in at least one embodiment, the base plate is welded on the rim over its entire periphery so as to improve the strength of the connection between the body and the base plate of the fin module.

According to at least one embodiment of the invention, the method comprises a preliminary step of manufacturing the body, the fluidic connection member and the fin module, for example by machining.

Advantageously, by way of one or more embodiments, the body, the fluidic connection member and the fin module are made of the same material, preferably metal. Using the same material limits the phenomenon of galvanic corrosion.

Further advantageously, by way of one or more embodiments, the body, the fluidic connection member and the fin module are made of aluminum.

Preferably, in at least one embodiment, the body, the fluidic connection member and the fin module are made of series 6063 aluminum, which ensures the cooling performance necessary for the application in question. Series 6063 aluminum is also a particularly durable material over time.

According to at least one embodiment of the invention, the central rib has a flat contact surface with the base plate of the fin module to improve the quality of the weld between the central rib and the base plate of the fin module.

Advantageously, by way of one or more embodiments, the width of the central rib is between 3.9 and 6 mm. This allows the stiffener to be wide enough to allow friction-stir welding while being narrow enough to maximize the number of fins and thus improve the thermal performance of the heat sink.

BRIEF DESCRIPTION OF THE DRAWINGS

Further characteristics and advantages of one or more embodiments of the invention will further appear upon reading the description that follows. This is purely illustrative and should be read in conjunction with the appended drawings in which.

DETAILED DESCRIPTION OF THE INVENTION

Figure 1:
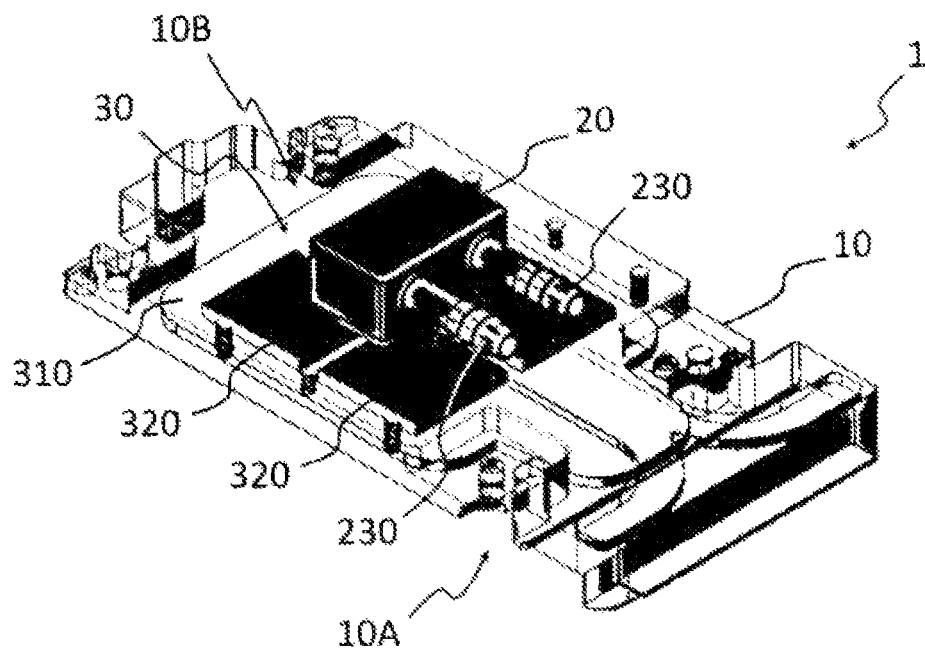
FIG. 1 schematically illustrates a heat sink according to one or more embodiments of the invention, the body being shown in transparency.

FIG. 1 shows an example of heat sink 1 according to one or more embodiments of the invention. The heat sink 1 is intended to be installed in a supercomputer coolant cooling system.

Heat sink 1

Figure 2:
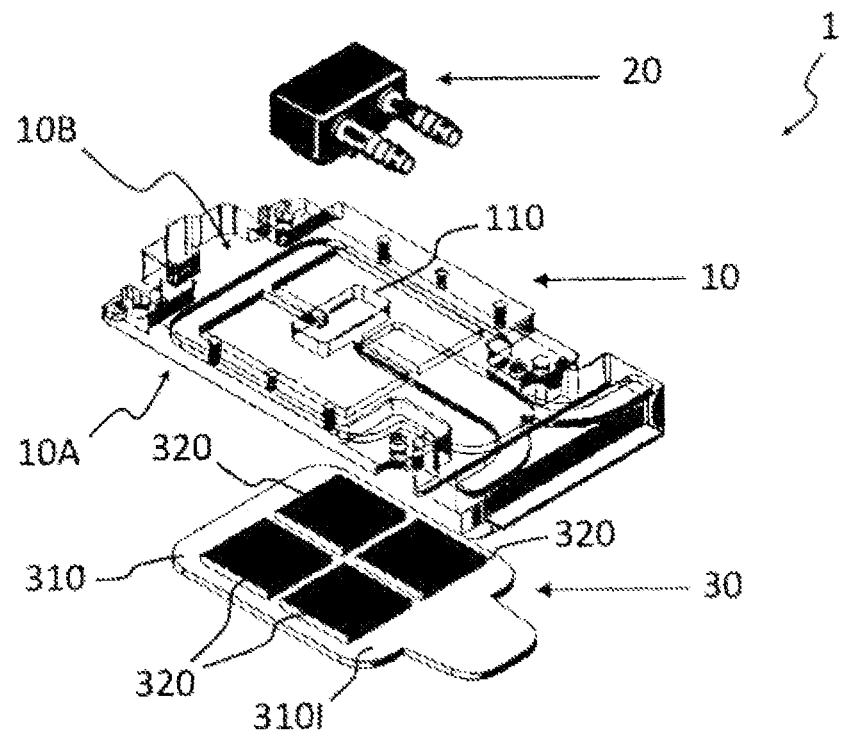
FIG. 2 is an exploded view of the heat sink of FIG. 1 showing the body, the fluidic connection member, and the fin module, according to one or more embodiments of the invention.

In reference to FIGS. 1 and 2, by way of at least one embodiment, the heat sink 1 comprises a body 10, a fluidic connection member 20, and a heat dissipation fin module 30.

Body 10

The body 10, by way of at least one embodiment, comprises a heat collection face 10A, intended to be positioned beside an electronic component generating heat (not shown) in order to collect said heat.

The body 10, by way of at least one embodiment, also comprises a fluidic connection face 10B, opposite the heat collection face 10A.

Figure 3:
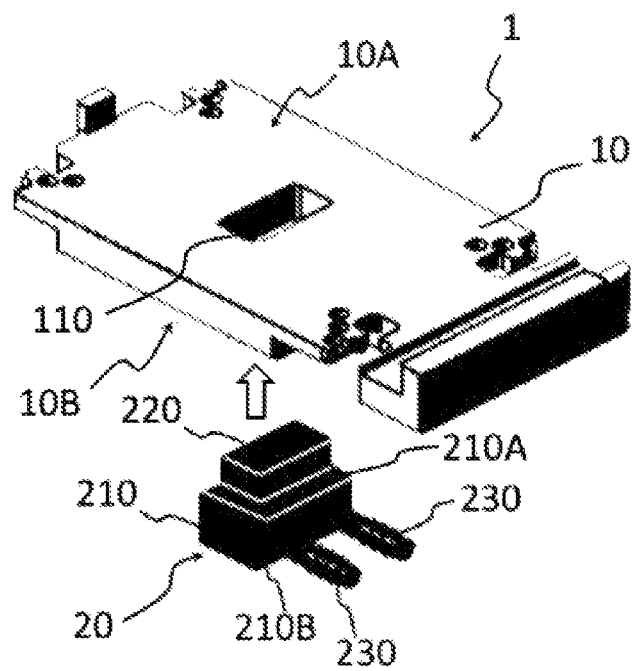
FIG. 3 schematically illustrates the assembly of the fluidic connection member on the body, according to one or more embodiments of the invention.

The body, by way of at least one embodiment, 10 delimits a central through-hole 110, visible in particular in FIGS. 2 and 3, connecting the heat collection face 10A and the fluidic connection face 10B.

Figure 5:
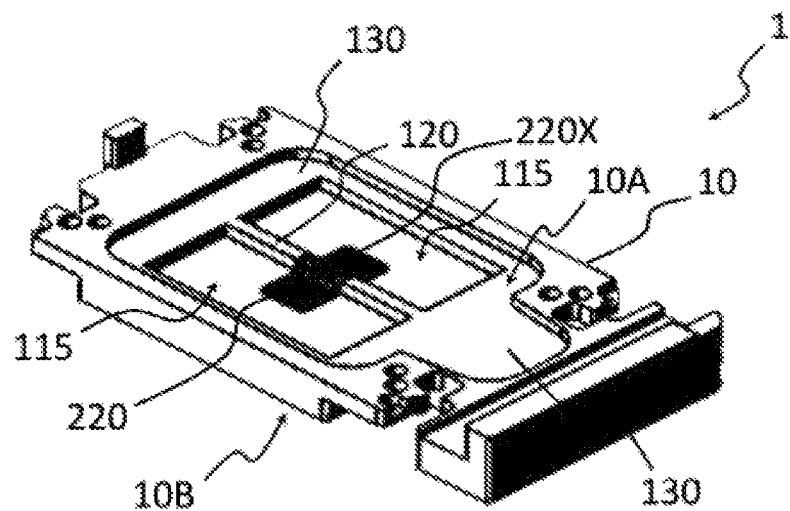
FIG. 5 schematically illustrates the heat collection face of the body wherein the cavities and the central rib have been machined, according to one or more embodiments of the invention.
Figure 6:
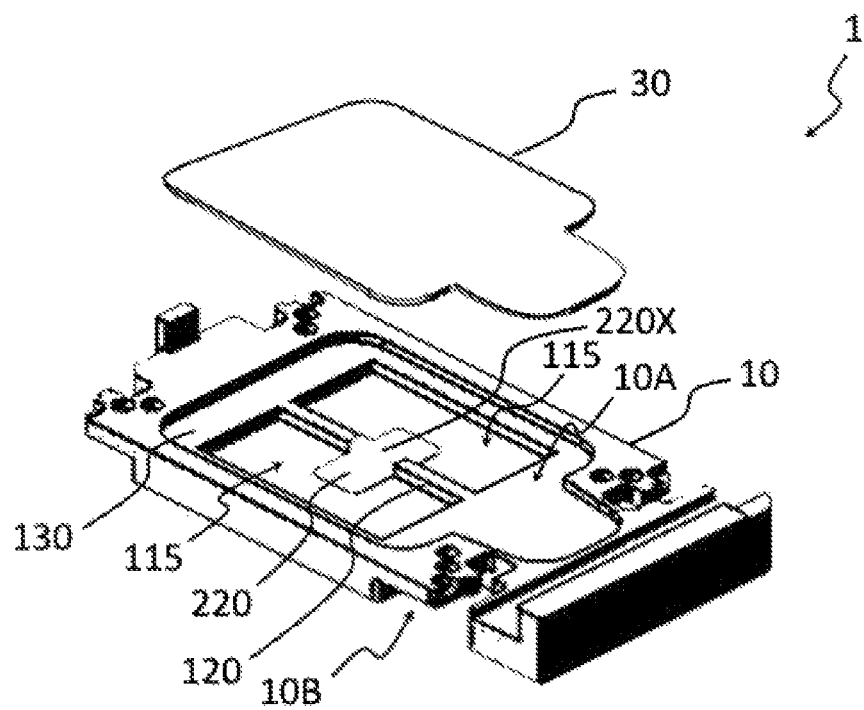
FIG. 6 schematically illustrates the assembly of the fin module on the body, according to one or more embodiments of the invention.

As shown in FIGS. 5 and 6, by way of at least one embodiment, two rectangular cavities 115 and a peripheral rim 130 are formed in the heat collection face 10A, the two cavities 115 being separated by a central rib 120.

Fluidic Connection Member 20

In reference to FIG. 3, by way of at least one embodiment, the fluidic connection member 20 comprises a central part 210, a fastening element 220, and two conduits 230 for circulating a cooling liquid.

Still in reference to FIG. 3, by way of at least one embodiment, the central part 210 is of parallelepiped shape and comprises a first face 210A from which the fastening element 220 extends and a second face 210B from which the two conduits 230 extend.

One of the conduits 230 allows receiving the cooling liquid to capture the calories supplied by the fin module 30 while the other conduit 230 allows evacuation of the flow of the cooling liquid thus heated to route it out of the heat sink 1.

In the example of the figures, by way of at least one embodiment, each conduit 230 comprises a nipple for connecting and maintaining a tube (not shown), preferably flexible, for example made of a plastic material, to circulate the cooling fluid.

In the example of the figures, by way of at least one embodiment, the first face 210A and the second face 210B are not opposite faces of the central part 210, but could be in another embodiment.

In this example, by way of at least one embodiment, the fastening element 220 is also in the form of a parallelepiped shaped part with dimensions slightly smaller than the dimensions of the central part 210.

The fastening element 220 is shaped to engage with force, i.e. by friction and locking, in the through-opening 110 in order to hold the fluidic connection member 20 on the body 10.

In reference to FIGS. 5 and 6, by way of at least one embodiment, the fastening element 220 comprises, at the part located on the side of the collection face 10A of the body 10, a portion 220X forming the central rib 120 delimited by the two cavities 115 of the heat collection face 10A of the body 10.

Fin Module 30

In reference to FIG. 2, by way of at least one embodiment, the fin module 30 comprises a base plate 310 and four assemblies of heat dissipation fins 320. In at least one embodiment, the fin module 30 could comprise more or less than four assemblies of fins, preferably an even number.

Figure 7:
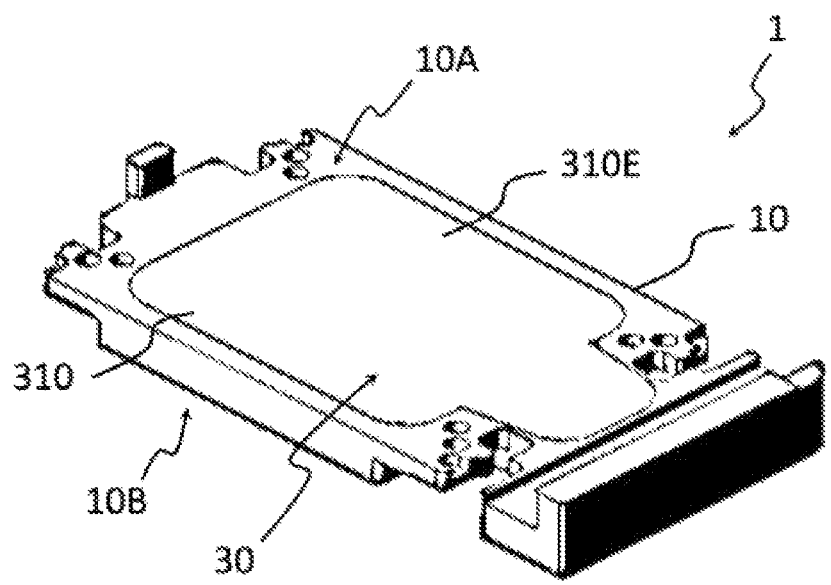
FIG. 7 schematically illustrates the fin module assembled on the body, according to one or more embodiments of the invention.

The base plate 310 is rectangular in shape and comprises an outer face 310E (FIG. 7) and an inner face 310I (FIG. 2). The outer face 310E is intended to come opposite the electronic component(s) to be cooled to collect their heat.

The two assemblies of fins 320 extend from the inner face 310I, each positioned in one of the cavities 115 formed in the heat collection face 10A of the body 10.

Figure 9:
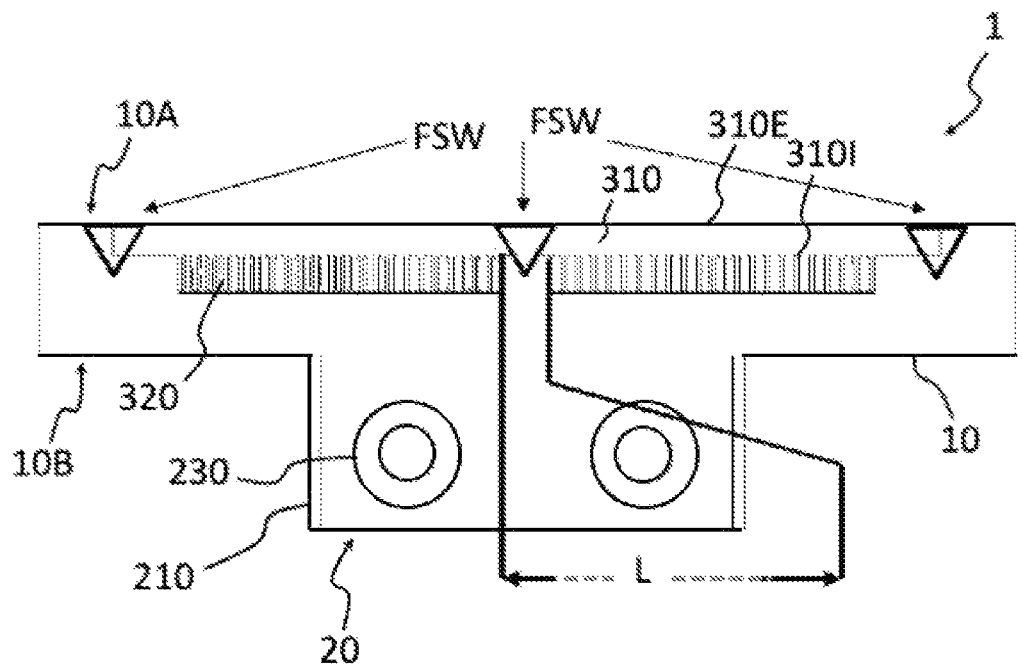
FIG. 9 is a sectional view of the assembled and welded heat sink, according to one or more embodiments of the invention.
Figure 10:
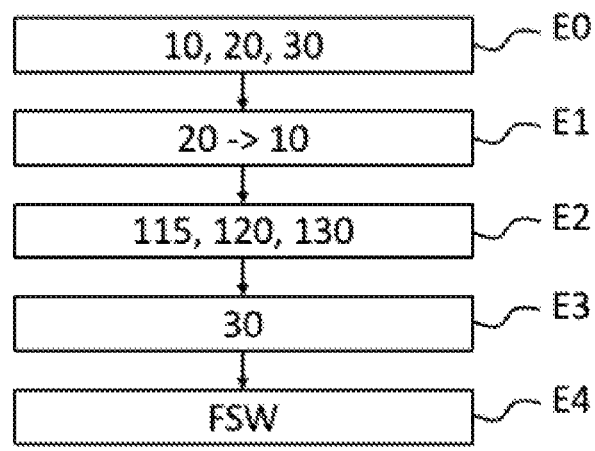
FIG. 10 schematically illustrates a method for manufacturing according to one or more embodiments of the invention.

As shown in FIG. 9, by way of at least one embodiment, the fins of the fin assemblies 320 extend perpendicularly from the inner face 310I of the base plate 310 and allow the heat received from the electronic component(s) to be cooled through the base plate 310 to be collected and transferred to the refrigerant circuit circulating between the two conduits 230.

Example of Manufacture

First, by way of at least one embodiment, in a preliminary step E0, the body 10, the fluidic connection member 20 and the fin module 30 are manufactured separately, preferably by machining in series 6063 aluminum.

Figure 4:
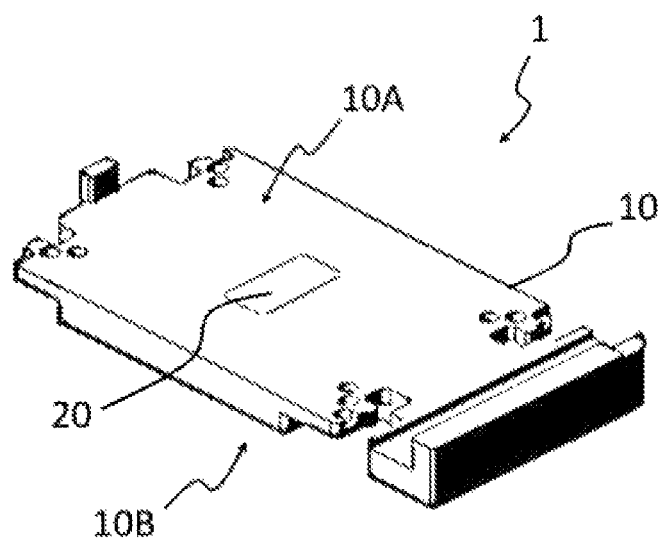
FIG. 4 schematically illustrates the fluidic connection member assembled on the body, according to one or more embodiments of the invention.

Next, in order to manufacture the heat sink 1 according to one or more embodiments of the invention, the method comprises a step E1 of positioning the fastening element 220 of the fluidic connection member 20 in the through-opening 110 of the body 10 by forcing it so that it is flush with the heat collection face 10A of the body 10, as shown in FIG. 4. At this stage, the central rib 120 is not yet formed.

Next, a step E2 of machining the heat collection face 10A of the body 10 makes it possible to form the two cavities 115, the central rib 120, made of both material of the fastening element 220 of the fluidic connection member 20 and material of the heat collection face 10A of the body 10, and a support rim 130 of the base plate 310 of the fin module 30.

In step E3, the fin module 30 is positioned on the body 10 so that each assembly of fins 320 is placed in one of the cavities 115.

Figure 8:
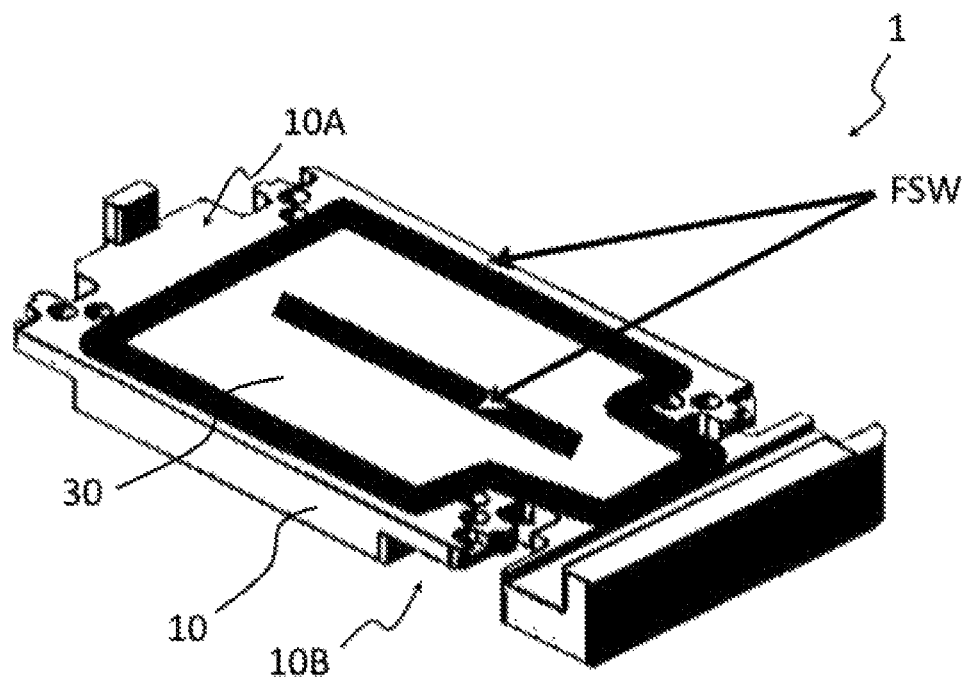
FIG. 8 schematically illustrates the welding of the fin module to the body by friction-stir welding, according to one or more embodiments of the invention.

Finally, a step E4 of friction-stir welding allows welding the base plate 310 both at the machined central rib 120 and at the machined rim 130, preferably over its entire perimeter. The FSW welding zone is shown notably in FIGS. 8 and 9.

In reference to FIG. 9, by way of at least one embodiment, the width L of the central rib 120 is preferably chosen to be wide enough to allow for quality friction-stir welding while being narrow enough to maximize the number of fins that may be received in the cavities 115. Thus, preferably, the width of the central rib 120 is between 3.9 and 6 mm.

The invention thus has many advantages, in particular to avoid the use of brazing products while conferring strength to the heat sink at low cost, by way of one or more embodiments of the invention.

The invention claimed is:

1. A method for manufacturing a heat sink for a liquid cooling system of a compute blade of a supercomputer, said heat sink comprising a body, a fluidic connection member and a heat dissipation fin module, said body comprising a heat collection face, intended to be positioned beside an electronic component generating heat, and a fluidic connection face, opposite said heat collection face, the body delimiting a central through-opening connecting the heat collection face and the fluidic connection face, said fluidic connection member comprising a central part of parallelepiped shape from which extends, from a first face, a fastening element and, from a second face, two conduits for circulating a cooling liquid, said heat dissipation fin module comprising a base plate and at least two fin assemblies extending from a face of said base plate, said method comprising:

positioning the fastening element of the fluidic connection member in the central through-opening of the body so as to be flush with the heat collection face of the body, machining the heat collection face so as to form two cavities for receiving the at least two fin assemblies of the heat dissipation fin module, a central rib, made of both material of the fastening element of the fluidic connection member and material of the heat collection face of the body, and a support rim of the base plate of the heat dissipation fin module, p1 placing the heat dissipation fin module on the body bearing on the support rim so that each assembly of fins of the at least two fin assemblies is arranged in one of the two cavities, friction-stir welding of the base plate at the central rib that is machined and at the support rim that is machined.

2. The method according to claim 1, wherein the base plate is welded over more than half a length of the central rib.

3. The method according to claim 2, wherein the base plate is welded on more than three-quarters of the length of the central rib.

4. The method according to claim 1, wherein the base plate is welded onto the support rim over its entire periphery.

5. The method according to claim 1, further comprising manufacturing the body, the fluidic connection member and the heat dissipation fin module prior to said positioning.

6. The method according to claim 1, wherein the body, the fluidic connection member and the heat dissipation fin module are made of a same material.

7. The method according to claim 6, wherein the body, the fluidic connection member and the heat dissipation fin module are made of aluminum.

8. The method according to claim 7, wherein the body, the fluidic connection member, and the heat dissipation fin module are made of series 6063 aluminum.

9. The method according to claim 1, wherein the central rib comprises a flat contact surface with the base plate of the heat dissipation fin module.

10. The method according to claim 1, wherein a width of the central rib is between 3.9 and 6 mm.

* * * * *